United States Patent [19]

Krüger et al.

[11] Patent Number: 4,773,877

[45] Date of Patent: Sep. 27, 1988

[54] CONTACTOR FOR AN ELECTRONIC TESTER

[75] Inventors: Gustav Krüger, Herrenberg; Sven Hinnerwisch, Nufringen, both of Fed. Rep. of Germany

[73] Assignee: Feinmetall GmbH, Herrenberg, Fed. Rep. of Germany

[21] Appl. No.: 86,723

[22] Filed: Aug. 17, 1987

[30] Foreign Application Priority Data

Aug. 19, 1986 [DE] Fed. Rep. of Germany ....... 3628116
Sep. 11, 1986 [DE] Fed. Rep. of Germany ....... 3630888
Feb. 14, 1987 [DE] Fed. Rep. of Germany ....... 3704711

[51] Int. Cl.⁴ .......................................... H01R 13/05
[52] U.S. Cl. ..................................... 439/482; 439/844
[58] Field of Search ...................... 439/66, 69, 74, 80, 439/81, 482, 844

[56] References Cited

U.S. PATENT DOCUMENTS 2,922,948  1/1960  Washburn ............................ 439/482
4,647,126  3/1987  Sobota, Jr. ........................... 439/74

FOREIGN PATENT DOCUMENTS 3507464  3/1984  Fed. Rep. of Germany .

Primary Examiner—Joseph H. McGlynn
Attorney, Agent, or Firm—Herbert Dubno

[57] ABSTRACT

The contactor is used for an electronic tester for testing of electronic items such as printed circuit boards, integrated circuits or the like. It has at least one resilient contact pin which has a piston member and a spring. The piston member and the spring are formed in a single piece from a single piece of metal sheet.

39 Claims, 6 Drawing Sheets

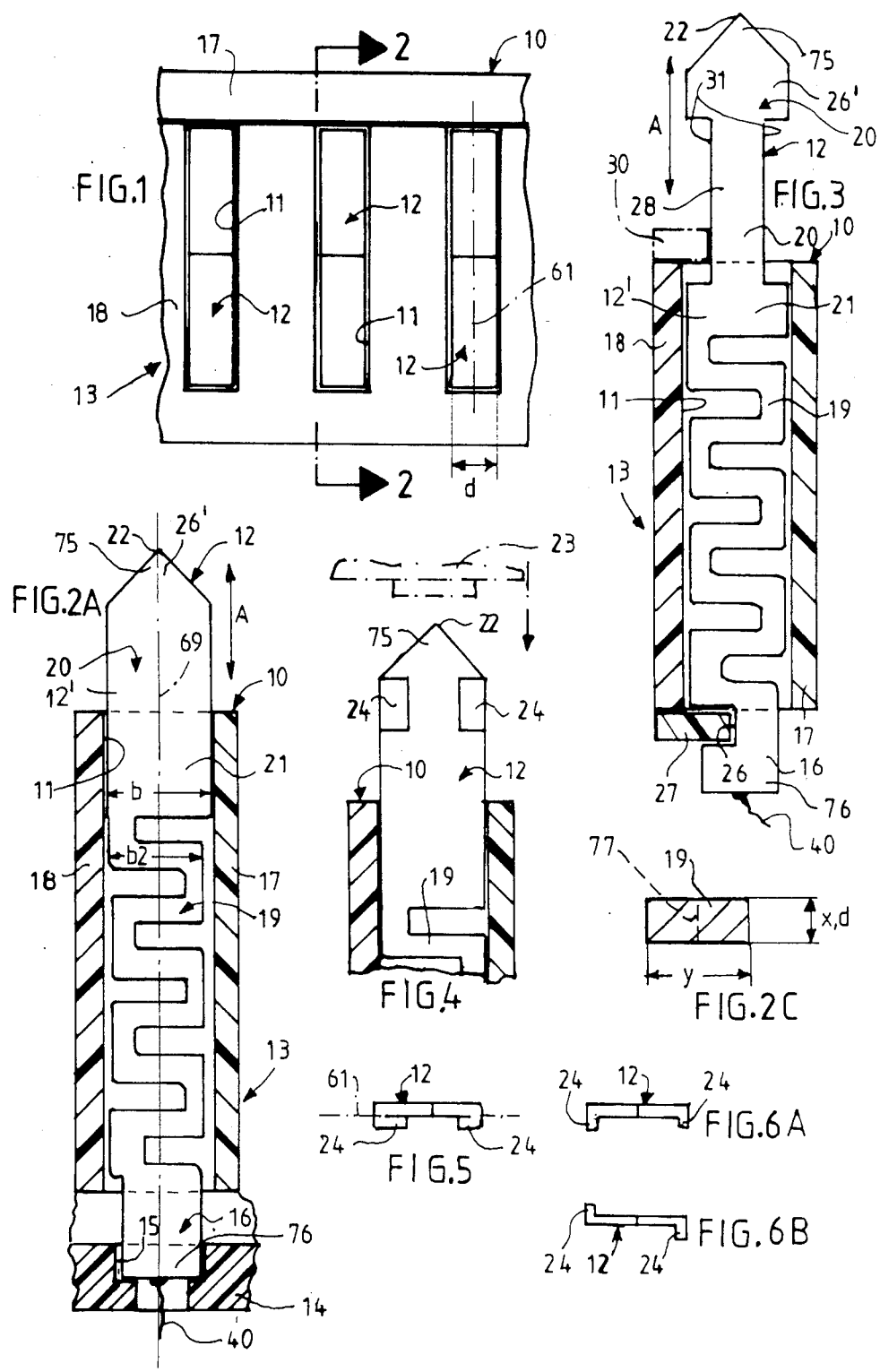

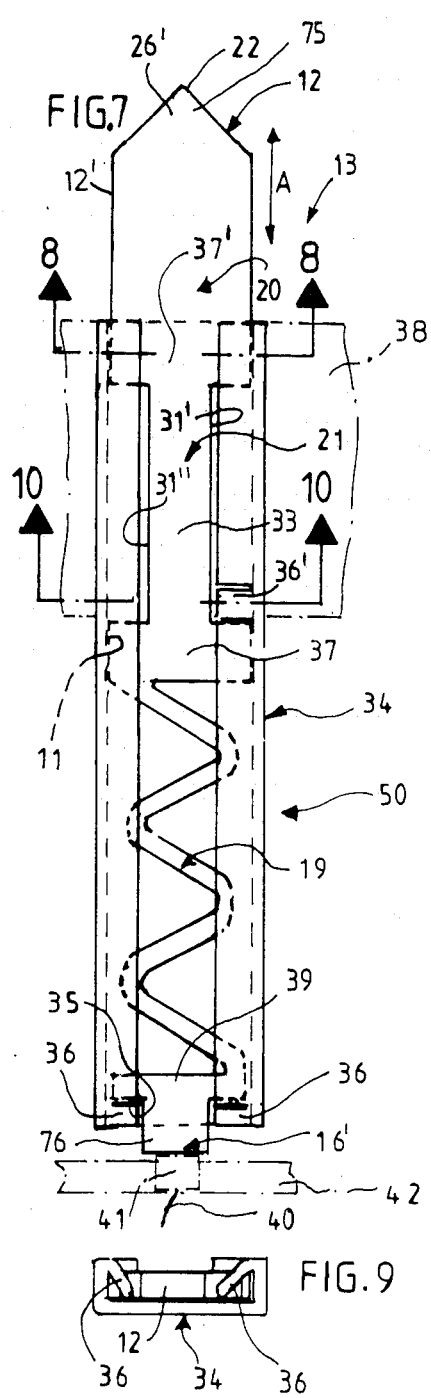
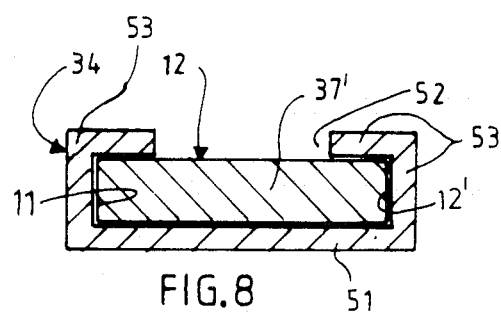
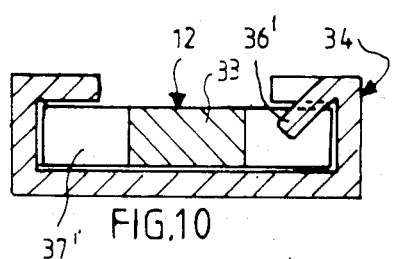

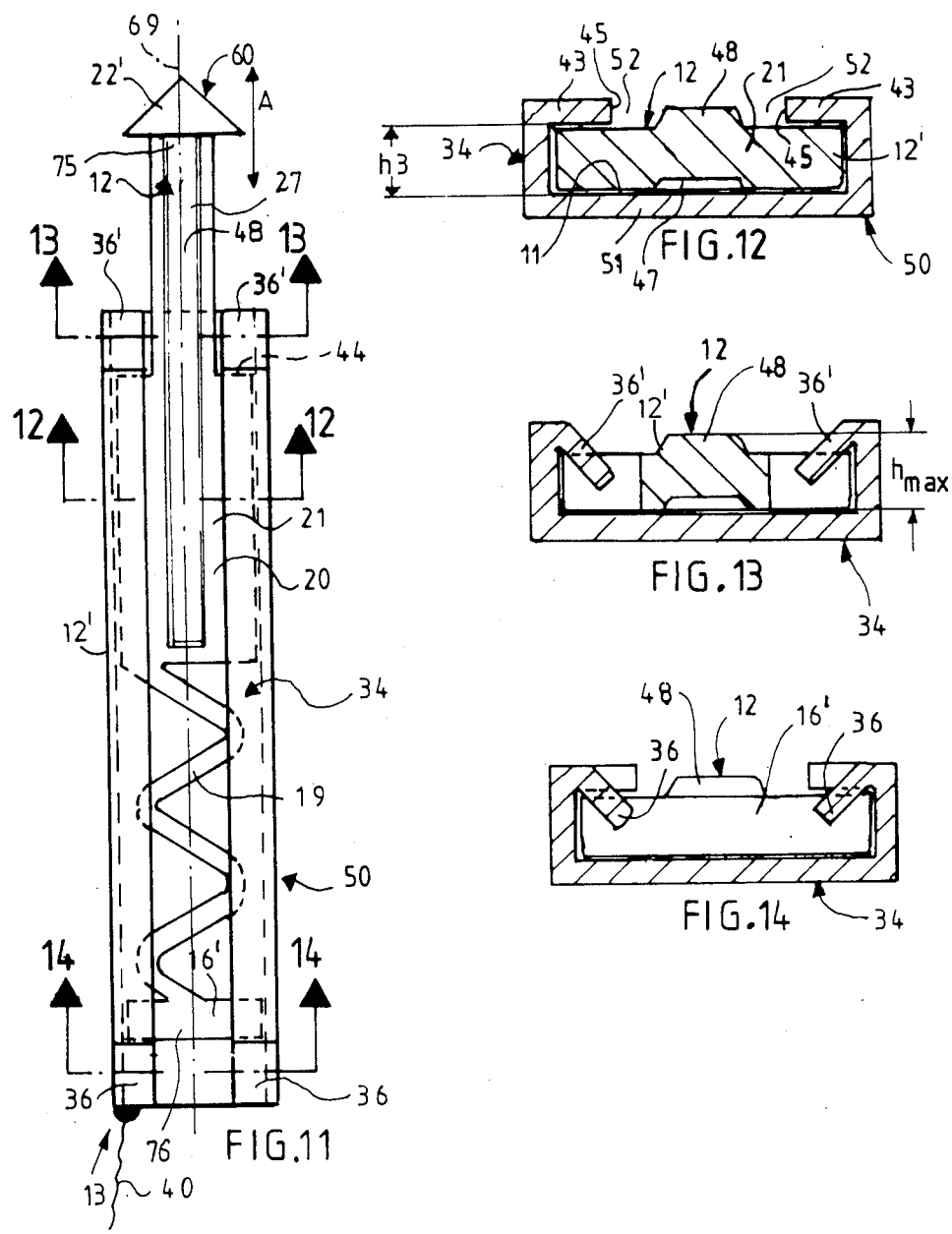

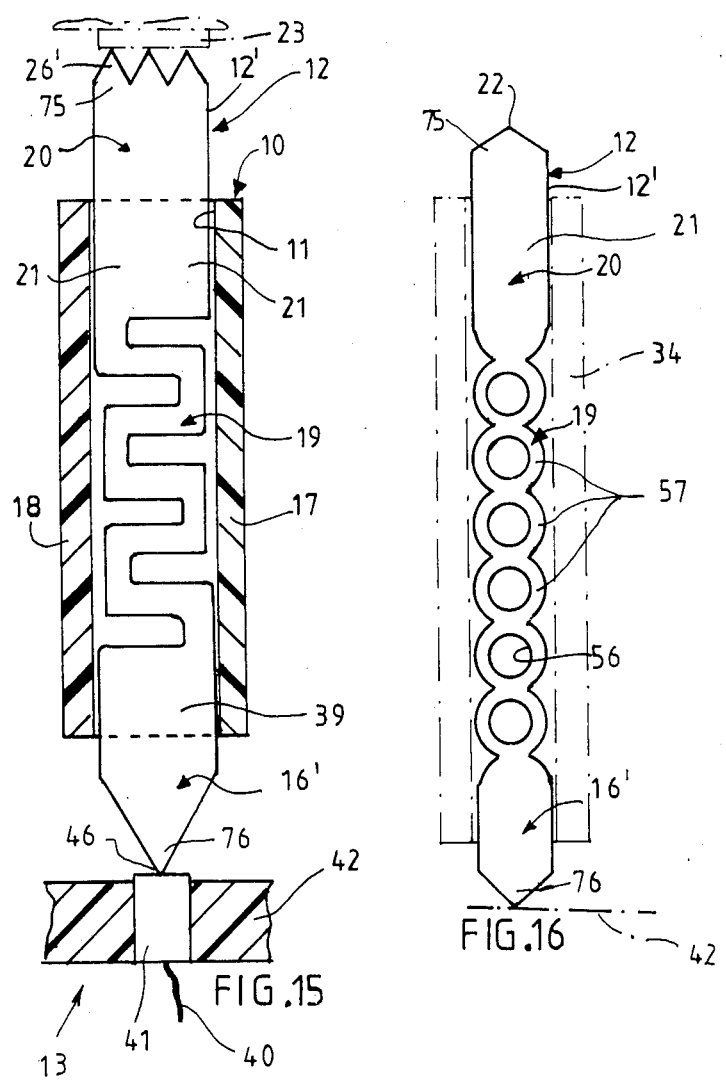

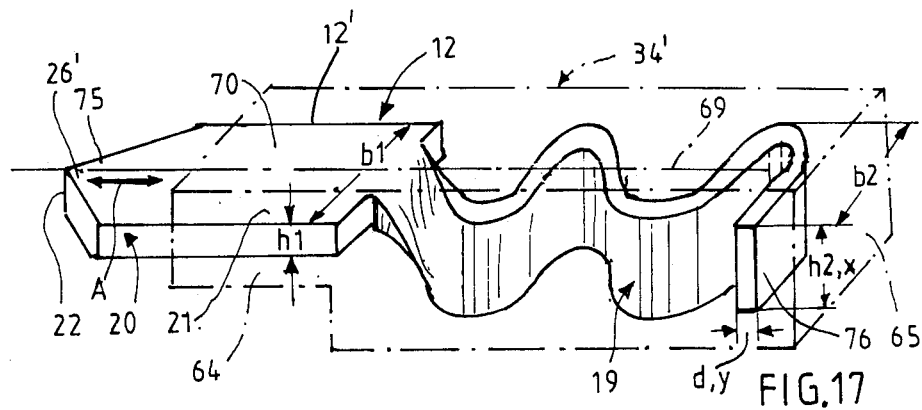
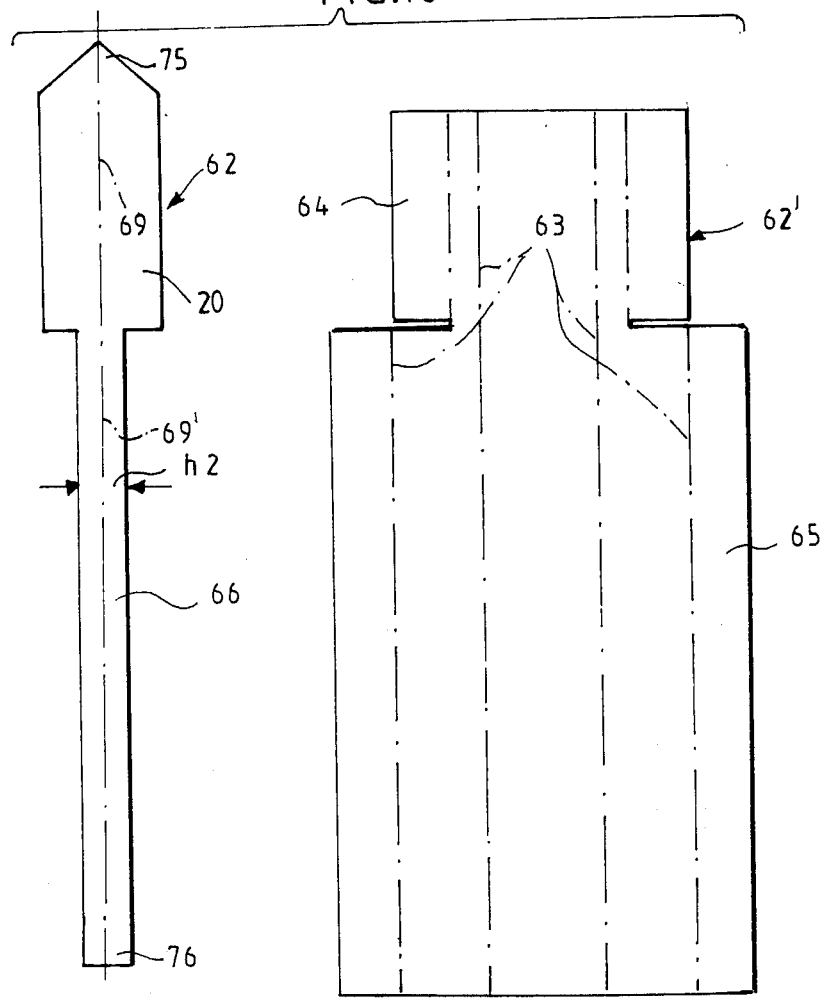

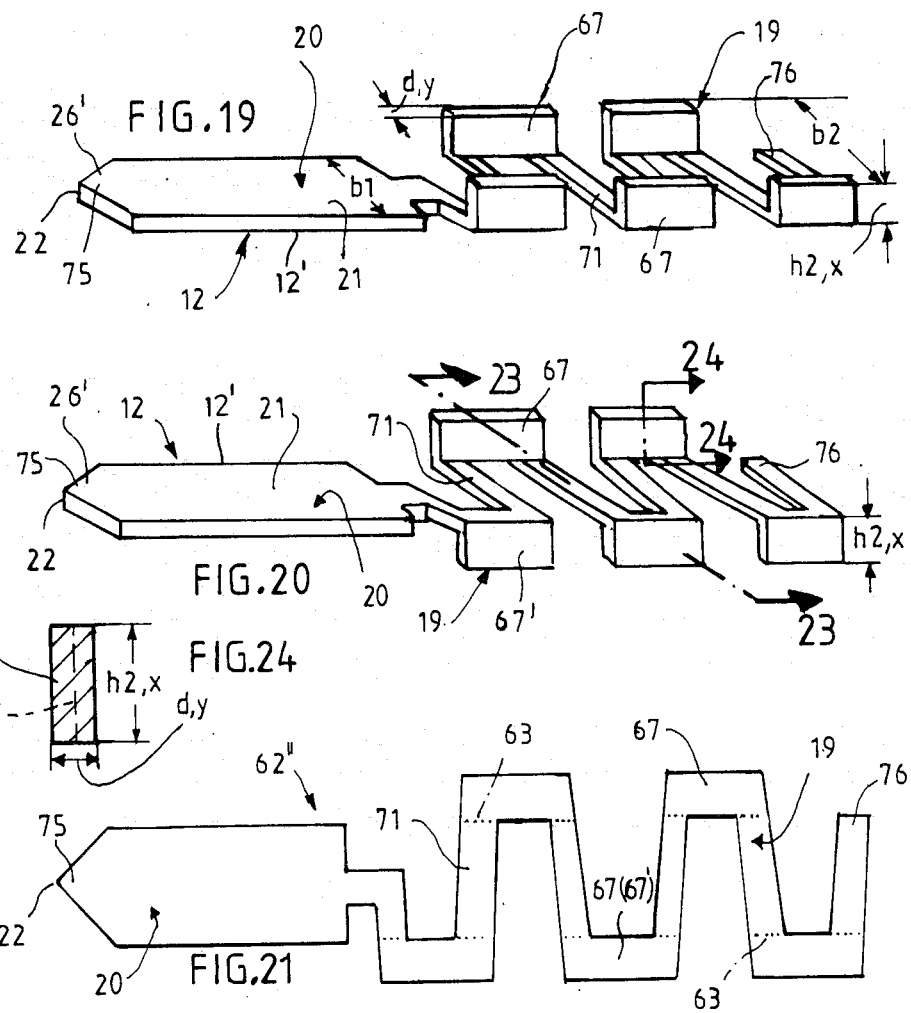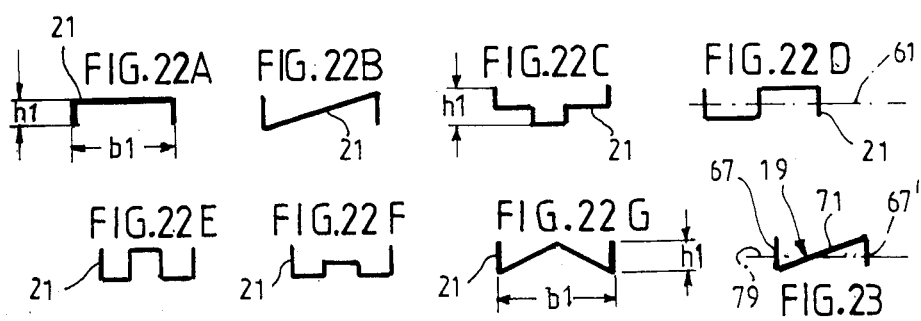

CONTACTOR FOR AN ELECTRONIC TESTER

FIELD OF THE INVENTION

Our present invention relates to a contactor for an electronic tester for testing an electronic device such as a printed circuit board, an integrated circuit or the like, more particularly the invention relates to a contactor which has at least one resilient contact pin, advantageously a plurality of resilient contact pins, which are electrically conducting and engage the contacts or terminals of the electronic device, each of the resilient contact pins having a plunger member whose plunger is guided linearly in a slot. The plunger member is followed in the axial direction by a spring.

BACKGROUND OF THE INVENTION

The electronic tester referred to above is used for testing electrical or electronic devices such as printed circuit boards, integrated circuits or the like for accuracy and correct performance. Known resilient contact pins (see for example, Krüger, "Prüfmittel zur elektrischen Prüfung von Leiterplatten für Uhren", Jahrbuch der Deutschen Gesellschaft für Chronometrie, Band 30, 1979, pp. 269-276; German Open Patent Application No. 35 07 464) has a cylinder in which the round cross section massive plunger head of the plunger member is supported so as to be axially slidable.

This plunger head is spring loaded by a compressed coil spring against whose force it is pushed during testing of the electronic device by the tester.

The spring must exert a comparatively large contact force, primarily about 50-300 cN, inspite of the comparatively small size of such a resilient contact pin.

The electric contact resistance between the parts of this resilient contact pin increases the electrical current flow resistance and it increase as usual with the number of load cycles.

The plunger member and the cylinder of the known resilient contact pin are made by machining, e.g. on a lathe and the spring is made on an automatic spring winder. According to the special application involved the parts are galvanically coated and assembled in manually operated or automatic devices. Even when the individual manufacturing steps occur in an automatic machine, the cost for manufacture of such high quality resilient contact pins is comparatively high.

OBJECTS OF THE INVENTION

It is an object of our invention to provide an improved contactor for an electronic tester.

It is also an object of our invention to provide an improved contactor for an electronic tester which is simply and economically assembled.

It is also an object of our invention to provide a contactor for an electronic tester which in standard operation has an especially small spacing between adjacent resilient contact pins corresponding to the positions of the contacts on the electronic device.

SUMMARY OF THE INVENTION

These objects and others which will become more readily apparent hereinafter are attained in accordance with our invention in a contactor for an electronic tester for testing an electronic device such as a printed circuit board, an integrated circuit or the like having at least one resilient contact pin, advantageously a plurality of resilient contact pins, which are electrically conducting and engage the contacts or terminals of the electronic device. Each of the resilient contact pins has a plunger member whose plunger head is guided linearly in a slot. The plunger member is followed in the axial direction by a spring.

According to our invention the plunger member and the spring of each of the resilient contact pins are jointly formed in one piece from a portion of metal sheet to form a resilient axial bar.

Since the spring together with the plunger member jointly are formed by a single piece of metal sheet, the bar is made most economically from a metal sheet, e.g. appropriately by punching, etching or the like and contrastingly by deformations not involving cutting such as folding, bending, stamping or the like.

After its punching or stamping, etching or the like and deforming without cutting, the bar can be deburred and provided with at least one chemically or galvanically applied coating, e.g. a nickel coating, gold coating or the like.

One or more such coatings can be provided already on the metal sheet before the piece for the bar is cut away by punching through it, etching or the like.

Also a multilayered coating or overcoat can be provided on the resilient contact pins.

The thickness of the metal sheet from which the advantageously flat bar is made can be very small, e.g. 0.05 mm upwards of and at most 1.5 mm, especially 0.10 to 1 mm, advantageously 0.2 to 0.4 mm and most desirably approximately 0.25 to 0.35 mm.

Other metal sheet thicknesses are possible as need arises. Thus with bars which are deformed from the plane of the original piece of metal sheet, especially small sheet metal thicknesses can be used, e.g. from 0.09 to 0.24 mm. The maximum width of the bar can suitably be larger, advantageously many times larger, than the thickness of the plate forming it. This maximum width can appropriately be at least 2 times, advantageously at least 3 times, as large as the thickness of the piece of metal sheet, advantageously approximately 4 to 20 times, most beneficially from 4 to 10 times that thickness.

The length of the bar can include the spring. Advantageously the entire bar including the portion that is the spring is straight or linear. Furthermore advantageously the entire bar is planar or flat or the spring and/or the plunger head of the bar are planar or flat.

A contactor is known (German Patent No. 1 790 052) for making contact with a plurality of resilient contacting elements mounted in a supporting block for a remote signal unit, particularly for contact of the contacts by pressing them against a printed circuit board. In this contactor the contacting elements are formed like curved flat springs meandering in a plane which are guided pairwise with their flat sides contacting one each other into holes or passages in the supporting body and into openings in the cover plate and project beyond the supporting block on the one side of the supporting block with their linear spring ends to form contact points and on the other side connector members.

This contactor is comparatively expensive to build because in each hole in the supporting body two springs are positioned beside each other and from each opening of the cover plate next to the electronic device tested two contacting elements project.

The springs contacting on each other with their flat sides can interact with each other and the size of the contact force put on the device tested during testing which both contact points exert on the same contacts of a device tested can swing uncontrollably and correspond also to the test current conducted through them.

Also no exact guiding of the contact points is guaranteed because the contacting elements have no linearly guided plunger members or plunger heads. The central spacing of the adjacent contact positions of each device tested must be correlated to a grid or array having a comparatively large size since the pairwise arrangement of the contacting elements formed like springs allows no small grid or array size.

Of course it is also possible in this contactor to form both springs of a spring pair by both legs of a U-shape bent member whose free leg ends form the contact points. However such a bent member is not formed like a bar but is like a hair pin. This then does not change the above mentioned disadvantages.

On the other hand according to our invention the resilient contact pins have a simple economical structure, exact guiding of the plunger members, allow extremely small central spacing of the adjacent resilient contact pins in the contactor, allow desired contact forces to be precisely correct and allow a variety of structures of the bar for fitting different requirements.

Since a part of the bar forms one spring at least this portion of the bar must have resilient elastic properties. For this purpose the metal sheet of the bar can be steel, copper-beryllium, nickel-beryllium, bronze, metallic compounds or other suitable metals or metallic alloys and can be homogeneous or provided with a single or many layer coating and/or coatings.

It is also possible to stamp or punch the metal sheet forming the bar in an inelastic state, deform it by folding or bending, stamping or the like and then to produce the resilient properties by heat treating, hardening or otherwise treating it. For example the metal sheet can be soft copper, beryllium and the rod made from it can then be heat treated to temper it for example for 1 hour at about 300° C. Alternatively it is given the elastic or resilient properties necessary for the spring by tempering or heat treating, hardening or the like the portion of the bar forming the spring and the residual regions of the bar have entirely different properties because of suitable treatment or by not being treated.

During manufacture of the bar from steel sheet the plunger member is so treated that it has a structure having the greatest possible rigidity, e.g. by hardening without tempering, in contrast to which the portion forming the spring is tempered, e.g. is subjected to a suitable heat treatment, after hardening to attain the most satisfactory possible elastic resilient properties.

The spring can be a flat spring. This spring can especially have an appropriate undulating course and/or at least one hole. However other forms are possible.

As mentioned the bar can be provided with chemical or galvanic layers or coatings applied in other ways which improve it by providing desired properties such as a high wear resistance of the plunger head of the plunger member. A hardened nickel coating is particularly satisfactory and contrastingly so is a coating or layering of noble metal or noble metal alloy. It can also be provided with an electrically insulating coating.

For the functions to be performed the metallic bar must be a satisfactory electrical conductor. Here it is advantageous that the spring together with the plunger member form a single piece so that no electrical contact resistance can exist or develop between the plunger member and spring. The conductor electrically connecting the resilient contact pin to the electronic tester can be directly connected to the rear end of the bar.

An electrical conducting wire can be soldered or welded or elastically pressed in the rear end of the bar in a connector, or a connecting element or connector can be clamped to it. The electrical conduction of the resilient contact pin then will not increase with the number of load cycles.

In the simplest case the resilient contact pin comprises the one piece bar or the bar and a contact head mounted on it. This allows a particularly small central and lateral spacing between neighboring resilient contact pins which allows the contacts to test electronic devices with correspondingly narrowly spaced adjacent test point.

A slider guide for the plunger head of the plunger member can be formed by a slot of a plate device or a plate, a block or other object in which the resilient contact pin is inserted. This plate device or the like can then have several or many such slots in which the resilient contact pins are or can be inserted and in which advantageously the springs of the bars can at least partially be positioned or located so that the springs can be secured and guided in a simple way against lateral bending. These springs can be located completely in the slots or, by contrast, can project beyond them. The plate, plates or the like can appropriately comprise an electrically insulated material, advantageously plastic, so that the resilient contact pin needs no electrical insulating coating or the slot must be provided with an insulating coating.

Since the resilient contact pins are located individually in separate slots or the like in the contactor and are electrically insulated from each other, each comprise only one bar or have only one bar they also result in a uniform contact with the test device and a uniform conduction like the contacting elements pairwise contacting each other according to German Patent No. 17 90 052.

The resilient contact pin according to our invention is used during testing of an electronic device to be tested and serves for conduction of a test current which is or can be independent of the test current flowing through the other resilient contact pins of the contactor.

The resilient contact pin according to our invention can be used in a variety of applications of which depend on the extremely small central and lateral spacing between neighboring resilient contact pins where the conventional resilient contact pin can not be used. It can allow an extremely small grid size for the contacts of the electronic device to be tested, especially in the case of positions to be contacted arranged in individual rows, for example on chips or pads.

The mounting of the resilient contact pins according to our invention is extraordinarily simple since no special mounting of the spring must occur but the bar need only be inserted in the slider guide or slot.

In many cases the resilient contact pin has a slider guide associated with it which advantageously can be made by stamping, etching or folding or bending metal sheet. It can however also be made from other materials including plastic, ceramic materials and the like. This slider guide of the resilient contact pin together with several or many such resilient contact pins can then be put in a contactor, e.g. in a tester adapter or the like of an electronic tester, e.g. in a face plate of a tester adapter.

Also it is particularly beneficial when both longitudinal end portions of the bar are formed by both longitudinal end regions of the metal sheet from which the bar is made.

The following definitions may assist in understanding the subsequent description:

The width b of the bar is measured parallel to the geometric width longitudinal central plane of its plunger member and perpendicular to its motion direction and thus perpendicular to its longitudinal dimension.

The height h of the bar is measured inclusive of the height of its spring perpendicular to the geometric width longitudinal central plane of the plunger member and perpendicular to its motion direction and thus perpendicular to its longitudinal direction.

The geometric width longitudinal central plane of the plunger member is parallel to its width and runs at half the maximum thickness of the plunger member.

The cross sectional width x of each cross section of the metal sheet forming the spring is the cross sectional dimension measured parallel to the neutral strand present at the fold (voltage zero line) and the cross sectional height y of the cross section is the cross section dimension measured perpendicular to that as shown in the example of FIGS. 2C and 24 in the following description. This cross sectional width and height do not coincide with the width and height of the spring.

It is desirable that the maximum width of the plunger member be greater than, advantageously twice as great as, its maximum height and/or the maximum width of the spring is greater than, advantageously twice as great as, its maximum height. It is desirable that the maximum width of the bar be greater than, advantageously twice as great as, its maximum height.

For security against spring breakage the portion of the metal sheet of the bar forming the spring is at least partially oriented approximately perpendicular and/or inclined to but not parallel to the geometric width longitudinal central plane of the plunger member. That portion or region which is inclined to the central plane can be bent out of the plane of the originally planar piece of the metal sheet.

A foot piece is advantageously connected to the spring or plunger head of the plunger member. Also stops can be provided in the slider guide to limit the motion of the bar.

Advantageously the ratio of the cross sectional width to the cross sectional height of the cross section of the metal sheet forming the spring is at least greater than 1:1, advantageously greater than 2:1, for that cross section which is acted on most strongly by folding or bending.

BRIEF DESCRIPTION OF THE DRAWING

The above and other objects, features and advantages of our invention will become more readily apparent from the following description, reference being made to the accompanying highly diagrammatic drawing in which:

FIG. 1 is a partially broken-away top plan view of a plate device of a contactor of a test adapter of an electronic tester for testing of electronic devices such as printed circuits or the like;

FIG. 2A is a cross sectional view taken along the section line 2—2 of FIG. 1;

FIG. 2B is a side elevational view of the small side of the flat bar of FIG. 2A;

FIG. 2C is a cross sectional view through the bar according to FIG. 2B taken along the section line 2C—2C;

FIG. 3 is a cross sectional view through a different plate device similar to FIG. 2A;

FIG. 4 is a partially broken-away cross sectional view through a different plate device similar to FIG. 2A;

FIG. 5 is a front view of the resilient contact pin of FIG. 4 which is a flat bar;

FIGS. 6A and 6B are front views of variants of the flat bar of FIG. 5;

FIG. 7 is a side elevational view of a resilient contact pin according to another embodiment of our invention;

FIG. 8 is a cross sectional view through the resilient contact pin of FIG. 7 taken along the section line 8—8;

FIG. 9 is a rear view of the resilient contact pin according to FIG. 7;

FIG. 10 is a cross sectional view through a resilient contact pin according to FIG. 7 taken along the section line 10—10;

FIG. 11 is a side elevational view of a resilient contact pin according to another embodiment of our invention;

FIGS. 12, 13 and 14 are cross sectional views through the resilient contact pin according to FIG. 11 taken along the section lines 12—12, 13—13 and 14—14 thereof;

FIG. 15 is a side elevational view of a different embodiment of the plate device of FIG. 2A;

FIG. 16 is a plan view of a flat bar with a flat spring comprising a series of circular pieces according to another embodiment of our invention;

FIG. 17 is a perspective view of a flat rod of a resilient contact pin whose linear sliding guide is indicated with dot-dashed lines;

FIG. 18 is a plan view of a planar portion of metal sheet from which the bar and a linear sliding guide of FIG. 17 shaped like a sleeve are made by bending;

FIGS. 19 and 20 are perspective views of different embodiments of bars shown in FIG. 17;

FIG. 21 is a plan view of a planar portion of metal sheet from which both the bar according to FIG. 19 and also that according to FIG. 20 are made by bending;

FIGS. 22A to 22G are profile views of the plunger member of the bars according to FIGS. 17, 19 and 20 which compare the profiles and height of the plunger member associated with the springs;

FIG. 23 is a cross sectional view through the spring according to FIG. 20 taken along the section line 23—23; and FIG. 24 is a cross sectional view through the spring according to FIG. 20 taken along the section line 24—24.

SPECIFIC DESCRIPTION

In FIG. 1 a top view of part of a contactor 13 is shown which has a plate device or block 10 which has a plurality of rectangular cross section slots 11. In each slot 11 a single resilient contact pin 12 shaped like a flat bar is inserted as is seen in FIG. 2A.

This flat bar 12' which is a one piece insertable structural member has a constant thickness, is planar and its longitudinal axis is linear.

Instead of the plate device 10 a one piece plate or other object which has the slots 11 serving for guiding the flat linear bars 12' can be provided.

The flat bars 12' are received in plastic support plates 14 attached rigidly with them and positioned in a space below the plate device 10 with their rectangular cross section lower foot pieces 16.

These support plates 14 have stepped recesses 15 in whose step the rear ends of the flat bars 12' sit whereby the axial position of the upright flat bars 12' is fixed. These slotlike recesses 15 in the support plate 14 are small enough that the rear ends 16 of the flat bars 12' are kept in them held by friction. The plastic of the supporting plates is likewise electrically insulating like both plates 17 and 18 of the plate device 10.

The plates 18 of the plate device 10 have a plurality of rectangular slots 11 on one side parallel to each other which are closed on this side by a planar plate 17 attached to it so that the rectangular shape slots 11 are formed in a simple way during manufacture.

One such plate device 10 with inserted resilient contact pins 12 and supporting plate 14 comprises a contactor 13 which can be a test adapter or a module of a test adapter or it can be positioned on a test adapter in such a module or a plurality of such modules.

Also one such module can be provided with two rows of such slots without more in the same manufacturing process. This module or this plate device 10 is positioned on a support or frame of a test adapter together with the support plate 14. The test adapter can be electrically connected in a known way to a test unit of the electronic tester, see Kruger as above and its resilient contact pin 12 can act to simultaneously connect positions of the device tested.

The longitudinal metal flat bar 12 is made from a planar metal sheet advantageously by punching or stamping. The thickness of the metal sheet is advantageously 0.2 to 0.4 mm, often advantageously 0.25 to 0.35 mm. Such a sheet thickness is used also for other bars.

It is planar and has a constant thickness d as seen in FIG. 2B so that the geometric width longitudinal central plane 61 of its plunger member 20 which runs perpendicular to the plane of the FIGS. 1 and 2B is a symmetry plane of the bar 12' in which the longitudinal center axis 69 falls.

Its length L is much larger than its maximum width b (FIG. 2A), advantageously at least 10 times larger, especially at least 25times larger. This maximum width b is for its part substantially larger than the thickness d.

The bar 12' is placed with some play in the appropriate slot 11 and is secured by its form in it. Also it cannot rotate. It has the form shown in FIGS. 1 to 2B. And of course it has a flat spring 19 running in an undulating or meander pattern as illustrated in the plate of the flat bar 12. This flat spring 19 undulates transversely in the plane of this flat bar 12' with respect to the longitudinal axis 69 and forms a curved bent spring with a snakelike coiling as is apparent.

A flat plunger member 20 is connected to the top of this spring 19 and a short straight foot piece 16 is connected to the bottom of this spring 19 to form one piece. This flat plunger member 20 has both the straight plunger head 21 having a rectangular cross section of constant width axially slidable in slot 11 with sliding play which can be designated as a flat plunger and also a contact point 22 of a contact head 26' acting in this embodiment as the inner contact for the device to be tested such as the printed circuit board or the like of which one 23 is indicated with dot-dashed lines.

The plunger head 21 is the portion of the plunger member 20 having constant width which can be slid into the slot 11. An additional electrically conductive wire 40 is soldered on the foot piece 16 having that rectangular cross section. Each bar 12' is an electrical conductor and these bars 12' are individually insulated from each other.

The undulating flat spring 19 has a straight longitudinal axis which is coincident with the longitudinal axis of the bar 12'. This bar 12' has a linear longitudinal axis 69.

The spring 19 is not precompressed in this embodiment and is dimensioned so that it cannot be stuck in the slot 11 during the lifting motion of the plunger member 20 occurring during testing of the device to be tested in the direction of the double arrow A.

Here its width b2 can be equal to or, as the case requires, somewhat smaller than that of the plunger 21. Its thickness corresponds to that of plunger member 20 and is thus substantially smaller than its width. The flat spring 19 is thus likewise guided in the slot 11 forming a straight duct of constant thin cross section and cannot bend transverse to its longitudinal direction but is only axially compressible.

In operation the device to be tested is simultaneously pressed on the contact points 22 of the triangular flat contact head 26' of the flat bars 12' of the contactor and presses it downwardly against the compression force of the spring 19. After the testing is finished the device tested is moved away and the plunger member 20 returns then into its initial position.

To reinforce the upper end portion of the flat bar 12' projecting upwardly above the slot 11 the portion of metal sheet forming, this flat bar is punched out laterally with two flaps 24 which then as shown in FIGS. 4 and 5 are bent through a 180°. They can also be bent through an angle which was less than 180°, for embodiment about 90° both on the same side (FIG. 6A) or on opposite sides (FIG. 6B). Also other reinforcements of the flat bar 12 are possible. For embodiment one or more impressions or embossings 47, 48 can extend into the linear guide as shown in FIGS. 11 to 14 in one embodiment.

As mentioned the flat bar 12' can be provided with a chemical or galvanic layer or another coating which improves its desired properties, e.g. providing an electrical contact resistance which is as low as possible or intended to provide a high wear resistance of the plunger head of the plunger member, etc.

In this spring 19 of the bar 12 the measured cross sectional width x of each of their plate cross sections (FIG. 2C) parallel to neutral fiber 77 present in axial compression of the spring 19 corresponds to the thickness d of the sheet forming it. The perpendicular measured cross section height y of each cross section is larger than d in this flat spring 19.

The thickness d corresponds to the height of the spring 19 and the cross sectional height y runs perpendicular to the thickness d. The maximum width b2 of this spring 19 runs parallel to the cross sectional height y.

The spring 19 is shaped like a transverse "standing" wave train whose "plane of variation" is indicated as a "wave plane" to make clear that this wave train does not vary transversely. The wave plane should thus be that "plane of variation" in which a half height of the transverse wave spring 19 lies. In the embodiment according to FIGS. 1 to 2C this wave plane corresponds to the geometric longitudinal central plane 61.

The contactor 13 in FIG. 3 differs from that according to FIG. 2A in that the foot piece 16 of the flat bar 12' forming the resilient contact pin 12 which can be indicated similarly as a flat bar with a linear longitudinal axis has a recess 26 in which a plate 27 locks and engages to secure the axial position of this foot piece 16.

This plate 27 is attached to the plate 18 having the slot 11. This plate 18 and also the plate 17 which can correspond to the plates 17 and 18 of FIGS. 1 and 2, however, require no supporting plate 14 so that the contactor is formed particularly simply and economically. It has normally several or many of such resilient contact pins 12 forming the bars 12' which serve for simultaneous contact of separate test devices to be tested for test purposes and which are electrically insulating from each other for separate conduction of test currents for test purposes for the device tested.

When it is desired to limit the displacement of the plunger member 20 of the flat bar 12 having a longer portion 28 constricted in width, a plate 30 (illustrated by dot-dashed lines) is attached to the top side of the plate device 10 which engages in a stepped in one of the recesses 31 forming the constricted region 28.

This constricted region 28 forms a flat shaft of the plunger member 20 which connects a flat plunger head 21 with its widened flat contact head 26' in one piece.

In the presence of such a plate 30 the simultaneously associated plate 18 can extend along the slot 11 (which also goes for plate 27).

The snakelike transverse undulating spring 19 whose wave plane corresponds to the geometric width longitudinal central plane of the plunger member 20 can be continuously under compression since it is so long that it presses the plunger head 21 under compression against the plate 30.

One must then provide a curved spring 19 forming a bending spring having a linear longitudinal axis of suitable length. Then the foot piece 16 can be omitted and the snakelike flat spring 19 can contact the plate 27 alone.

In the embodiment according to FIGS. 7 to 10 the resilient contact pin 50 comprises a planar flat bar 12' with a linear longitudinal and a linear metallic slider guide 34 associated with it and formed as a special part.

This slider guide 34 can be put together with the slider guides 34 of a plurality of such resilient contact pins 50 in front plate 38 indicated by dot-dashed lines of a test adapter comprising a contactor in which it is held in a predetermined position secured from sliding axially downwardly.

This front plate 38 can have a single slot for each resilient contact pin 12 inserted in it in which the slider guide 34 is locked and is held immovably.

Alternatively one such contactor can be a module of a testing adapter or the like.

This slider guide 34 formed by a linear rod which has a substantially C-shaped cross section is a rectangular portion of metal sheet formed in one piece since this sheet is bent in the C-shape form apparent in FIG. 8 and thus forms a linear guide slot 11 for guiding the plunger head 21 of the linear plunger member 20.

The slot 11 is bounded by the planar broad side 51 and by the bent L shaped legs 53 of the slider guide 34 forming an intermediate space between themselves. The bar 12' is made of metal sheet similar to the portion used for the slider guide.

The zig-zag-shape planar flat spring 19 is connected to this plunger member 20 below it which, as shown, runs transversely in the same plane as the plunger member 20 and the foot piece 16' and whose wave plane corresponds to the geometric central plane of the plunger member 20.

The snakelike or undulating flat spring 19 formed by a curved bent spring with a linear longitudinal axis can advantageously be planar and also run in the same plane as the associated plunger member 20 and the foot piece 16'.

This plane runs parallel to its broad side in the longitudinal direction of the flat bar 12'. Also the entire flat bar 12' is planar in this embodiment and has a constant thickness so that it can be punched out of sheet metal.

The foot piece 16' connected at the bottom of the spring 19 in one piece sits with a shoulder 35 on two flaps 36. These flaps are inclined inwardly as seen in the lower view of FIG. 9 and are also at the lower end portion of the linear guide 34 formed from the bent portions of the metal sheet forming this guide by suitably reinforced bending.

This foot piece 16' in this embodiment forms a plunger member since its part located above the flaps 36 and inside the linear guide 34 of constant rectangular cross section has an axially movable plunger 39 with slider play in the slider guide 34 and thus the lower smaller end portion of the flat bar 12' is similarly linearly guided which improves the entire guiding of the flat bar 12'.

Inclined, inwardly guided, smaller flaps 36' are bent from another top located strongly bent short section of one of the bent portions of the linear guide 34. The flaps 36' project into cut in section or recess 31' of the plunger head 21 of the upper plunger member 20 and form a stop for the highest position of the lower portion 37 of plunger head 21 guided with play. This lower portion 37 is pressed by the compressed spring 19 as long as the plunger member 20 of the flat bar 12 is not depressed opposing the action of the spring 19. This spring 19 is guided in the linear slot 11, forming a duct, against lateral bending.

The plunger portion 37 together with the plunger portion 37' spaced above it effects the axial guiding of the massive plunger member 20 in the slider guide 34 having the C-shaped cross section. The flat inserted bar 12' including its triangular surface contact head 26' of the flat bar 12 is formed in one piece. The plunger head 21 has the linearly guided portions 37, 37' and the smaller strip like central region 33 formed by recesses 31', 31'' connecting them. The plunger head 21 is in the vicinity of the plunger member 20 which can be located in the linear guide 34 at maximum insertion depth.

In this embodiment the foot piece 16' of the flat bar 12 projects downwardly beyond the slider guide 34 and is pressed continuously elastically on a connector contact 41 located in a connector plate 42 indicated with dot-dashed lines for electrical connection of this flat bar 12 to a following conductor 40 by the spring 19. This pressing force can be applied by the spring 19 since the connector plate 42 in the contacting device 13 which can form a test adapter or a portion of a test adapter which is located so high that it lifts the shoulder 35 from the flaps 36

In the embodiment according to FIGS. 11 to 14 a special triangular contact head 22' of constant thickness is welded on the upper end of the flat single piece bar 12' having a straight longitudinal axis 69. It is composed of a hardened and/or wear resistant material such as metal sheet of the flat bar 12' so that the entire bar 60 is composed of the two portions 12 and 22'.

This straight spring contact pin 50 has a flat rod like linear slider guide 34 made by punching and bending advantageously from metal sheet with a C-shaped cross section in whose linear slot 11 the plunger head 21 of the linear plunger member 20 of this flat bar 12' is axially slidable locked in place.

A shaft 27 of reduced width connects in one piece to the flat plunger head 21 of the flat plunger member 20 at the top of the shaft 27. The shaft 27 carries the contact head 22' so that as illustrated the plunger head 21 is located completely inside the slider guide 34.

The planar flat spring 19 is connected to the bottom of the plunger head 21 which ends in a planar foot piece 16' which can form an additional plunger guided in the linear slider guide 34 and according to FIG. 14 sits on two flaps 36 of the metal sheet of the slider guide 34 bent in and inclined.

The spring 19 whose wave plane runs parallel to the geometric width longitudinal plane of the plunger member 20 can be precompressed since it can press the shoulder 44 of the flat bar 12' present on the upper end of the plunger head 21 on two flaps 36' formed from the metal sheet of the slider guide 34 bent and inclined inwardly according to FIG. 13.

These flaps 36' are first bent interiorly after insertion of the plunger head 21 into the slider guide 34 and held so the flat bar 12' is held in the linear guide 34 with the flaps 36. In testing devices to be tested these devices are pressed on the points of the contact heads 22' and press the plunger member 20 downwardly against the force of the spring 19. On taking away the device to be tested this spring 19 presses again the plunger member 20 until its shoulder 44 contacts on the flaps 36' upwardly. One can refer to the bar 12'—also the total bar 60—on account of its flat structure as a flat bar 12' and/or a totally flat bar 60.

The form fitting guiding of the plunger head 21 is apparent from FIG. 12.

In this embodiment the plunger member 20 of the bar 12' having a substantially rectangular cross section has an imprinting or embossing beginning at the contact head 22' and reaching to shortly before the lower end of the plunger head 21 which includes a flat groove 47 on the side facing the planar broad side 51 of the slider guide 34 and a corresponding flat bulged portion 48 on the other flat side of the plunger member which however is not widened to the maximum breadth of the spring contact pin 50 since the bulged portion 48 projects in the vicinity of the slider guide 34 in the gap 52 between the longitudinal edges 45 of the legs 43.

This embossing can extend also as desired over the entire length of the flat bar 12' or be otherwise longer or shorter than illustrated. The width of the slot 11 of this linear guide 34 is as is apparent from FIGS. 12 to 14 so large that the plunger head 21 is supported linearly guided in the slot 11 with only slight play.

By this embossing of the plunger member 20 forming the groove 47 and the bulged portion 48 practically without sacrificing rigidity increases its maximum height $h_{max}$. The increase of the height does not in itself effect an increase in the smaller interior height h3 of the linear guide 34 and the maximum height of this spring contact pin.

In this embodiment a conductor 40 attached to its metallic slider guide 34 is connected to a tester for electrical connection of this resilient contact pin 50. Preferably a conductor is connected directly to the flat bar as is shown in the other embodiments since then the electrical contact or transfer resistance between the flat bar 12' and the slider guide 34 plays no role. In this embodiment however the electrical contact resistance is small because of the illustrated structure.

Instead of the illustrated slider guide 34 with the C-shaped cross section the slider guide 34 can be formed as flat plates when both bent legs 53 and/or 43 of the metal sheet are made so wide that they contact each other and the resulting sleeve forms a circumferentially closed duct advantageously approximately rectangular cross section for guiding the plunger and the spring. The legs of this sleeve can also be rigidly attached with each other at least one location by weld points as desired for reinforcement of them.

Instead of the snakelike undulating flat spring 19 other structures can be used, e.g. rings connected in one piece in a linear row of rings as is shown in the bar 12' in FIG. 16 in which the rings are more or less pressed together. The bar 12' according to FIG. 16 can be planar or have a constant thickness and include plunger head 21 and the foot piece 16' supported at 42 and can be guided linearly in a form fitting linear guide.

In FIG. 15 a variation of a planar flat bar 12' according to FIG. 2A is shown. In FIG. 15 the foot piece 16' of the flat bar 12' connected in one piece to the flat spring 19 forms a second flat plunger 39 present in addition to the plunger head 21 which is guided linearly slidable in the slot 11 with play. Thus the lower end portion of the flat bar 12' has a linear longitudinal axis and the total guiding of the flat bar is particularly good.

This foot piece 16' having the second plunger 39 is at the bottom end and lies with its point 46 on an electrical terminal 41 mounted in connector plate 42 on which this point 46 is pressed with the weight of the flat bar 12' and in the testing of the device to be tested is pressed with the spring force exerted by the transverse wavelike flat spring 19. It is thus connected in this embodiment to the conductor 40 not on the flat bar 12' but, as in the embodiment according to FIG. 7, to the contact 41. The contact head .26' of the bar 12' acting to come into contact with the device to be tested such as 23 is here sawtoothed. Also other structures of the contacting head 26' are naturally possible.

Naturally protection from breaking is desired for the spring 19. It can then take the largest possible load changes without breaking. With the springs 19 of the bars 12' according to FIGS. 1 to 16 with a planar structure the thickness d of the spring 19 is equal to its maximum height, since both sizes are identical. The safety from breaking of this spring 19 is thus large according to the size of the ratio of the cross sectional width x (FIG. 2C) of the cross section most susceptible to breaking of the metal sheet forming the spring 19 to the perpendicular cross sectional height y of the related cross section. When this ratio in the springs according to FIGS. 1 to 16 for the relative safety from breaking is made comparatively large, e.g. 1:1 or larger, this can throw open technical engineering problems and also lead to undesirable flat spring characteristics or a disadvantageously large plate thickness.

The safety from breaking of the spring 19 may be raised simply when the ratio of the cross sectional width x to the cross sectional height y of the cross section of the metal sheet forming the spring 19 or at least whose cross section is most endangered as far as breaking goes is at least 1:1, advantageously larger than 2:1. This allows stamping to be used with increased security against breaking of the spring 19. Thus very small central clearances are attainable in the adjacent resilient contact pins in the contactor since the region of the sheet portion of the bar 12' forming the spring 19 is bent at least partially into the geometric longitudinal central plane 61 (FIG. 22D) of the plunger member running advantageously bent but not parallel advantageously about 90°.

Thus spring has at least one region which is bent out from the plane of the plate segment from which its bar is formed. The total spring can be bent out from the plane of the metal sheet. Advantageously the region forming the spring 19 of the metal sheet of the rod 12 is twisted and rotated about an axis parallel to the motion direction of the plunger head that is about 90°. The maximum width b2 of the spring 19 can be greater than its maximum height h2 and it is greater than the thickness d of this spring 19 forming the plate. Embodiments of such bars are illustrated in FIGS. 17 to 24.

The bar 12', axially compressible as a result of the spring 19 formed-by a curved bending spring with a linear longitudinal axis according to FIG. 17, may be made from a planar metal sheet segment 62 according to FIG. 18 by bending, advantageously by punching, since the metal sheet portion 62 forming the plunger member 20 has connected to its planar region a rectangular small longitudinally extending strip 66 from which the spring 19 is formed by bending and whose straight longitudinal axis 69' coincides with the linear longitudinal axis 69 of the plunger member 20 in this embodiment.

However it can also be laterally displaced parallel to the position shown in FIG. 18. The front longitudinal end portion 75 and the rear longitudinal end portion 76 of the metal sheet portion form on the finished bar 12' its front end region 75 and its rear end region 76.

This thickness d of the metal sheet of the bar 12' can advantageously by very small, amounting particularly to about 0.1 to 0.25 mm. The spring 19 of the bar 12' of FIG. 17 can be advantageously formed from this strip 66 since the strip 66 is bent transversely into the shape of a wavelike sheet transverse to its longitudinal direction. After that this wavelike or wave plate like spring 19 on insertion of the plunger 21 of the plunger member 20 in the position shown in FIG. 17 rotates in its entirety about an axis running in the motion direction (double-headed arrow A) of the plunger member 20.

The width b2 of this spring 19 corresponding to its maximum width then runs parallel to the extent of the width of the plunger 21 so that the width b2 of the spring can correspond to the width b1 of the plunger member 20 or as desired be larger or smaller. Limitations because of the width b2 do not arise because of the wavelike structure of the spring transverse to its longitudinal direction. The ratio of the maximum cross section width x corresponding to the maximum height h2 of the spring 19 running perpendicularly to the geometric longitudinal central plane of the plunger member 20 about 90° to a cross sectional height y corresponding to the metal sheet thickness d of the sheet region rotated about 90° to the plane of the segment corresponds to a an apparatus whose manufacture is free of stamping problems and is larger than 1:1, advantageously substantially greater than that.

The springs 19 of the bars 12' according to FIGS. 19 and 20 have on the most greatly endangered peaks of the wavelike spring 19 as far as breaking goes ratios of the cross sectional width x to the cross sectional height y which are larger, advantageously substantially larger, than 1:1 and are likewise problem free from the standpoint of manufacture by punching or stamping.

In the spring 19 of FIG. 17 the metal sheet portion forming the spring as shown runs substantially perpendicular to the geometric width longitudinal central plane of the plunger member 20, i.e. both broad sides of the strips 66 from which the spring 19 is formed by bending run substantially perpendicular to the geometric width longitudinal plane of the plunger member 20 since the plate of the spring 19 is almost oriented perpendicularly to the named width longitudinal central plane.

Advantageously in such springs 19 at least partially bent out of the geometric width longitudinal plane of the plunger member the ratio of the maximum height h2 of the spring 19 to the thickness of its metal sheet d is greater than 1.2:1, particularly at least 2:1, often at least 4:1 is good and desirable. It is especially desirable to have the ratio of h2:d be from about 3:1 to 8:1. The maximum value of the ratio x:y can advantageously be greater than 1:1, is especially satisfactory when greater than 2:1 and is particularly beneficial when greater than 4:1.

Also in these embodiments it is appropriate to have other bars according to our invention in which the maximum width b2 of this spring 19 is greater, advantageously substantially greater than its maximum height h2. The ratio of the maximum width b2 to the maximum height h2 of the spring 19 can advantageously amount to 2:1, is especially satisfactory when at least 3:1, and is particularly beneficial when from 2.5:1 to 5:1.

The thickness d of the metal sheet of the segment 66 and thus also the thickness d of the sheet metal of the spring 19 can advantageously be 0.05 to 1 mm, especially can amount to 0.09 to 0.40 mm. The maximum height h2 of the spring 19 particularly be 0.2 to 2 mm and is especially beneficial when from 0.40 to 1 mm.

The plunger head 21 is planar in the embodiment according to FIG. 17 and its thickness h1 corresponds to the thickness of the metal sheet of the segment and thus also the thickness d of the sheet metal forming the spring 19. In this embodiment in consequence the thickness h1 of the plunger member 20 and thus the thickness of its plunger 21 is considerable smaller than the maximum height h2 of the spring 19.

In FIG. 22D the geometric width longitudinal central plane 61 of the plunger member is illustrated. In FIG. 17 this width longitudinal central plane runs parallel to the planar top side 70 of the plunger head 21 at half the maximum height of the plunger member 20 and thus at half the height of the planar plunger head 21. In this width longitudinal central plane the strip 66 of the segment 62 suitably can be transversely wavelike and then after this wavelike section is formed is rotated in its entirety about 90° about an axis aligned with this longitudinal axis 69 or parallel to the linear longitudinal axis 69 of the plunger member 20 so that the height h2 of the spring 19 corresponds to the width h2 of the strip 66 of the planar segment 62 and the spring 19 is positioned wavelike transverse in its final position parallel to the width longitudinal plane of the plunger member 20 as shown in FIG. 17. The transverse wave shape of the spring runs transversely to the linear longitudinal axis of the bar 20.

The bar 12' can be positioned again in some suitable way in the contactor carrying it so that its plunger head 21 is supported slidably in a slot in it. The spring 19 can be supported on the linear guide or on a suitable part such that it is compressed on motion of the plunger head 21 to the right in regard to FIG. 17 through a device to be tested or is pressed together strongly and the contacting force required to insure a reliable contact is exerted by the point 22 of the bar 12' on the device to be tested.

For embodiment this bar 12' can be accommodated in a dot-dashed sleeve 34' which can be formed by bending from the segment 62' (FIG. 18). The fold lines 63 of the segment 62' are indicated in dot-dashed lines in FIG. 18. Since the plunger head 21 in this embodiment is planar and has only the thickness h1 of the metal sheet forming it and is not profiled its linear guide must have a correspondingly small height which is slightly larger than h1 with play.

The sleeve 34' forming a slider guide for the plunger 21 and likewise receiving the spring 19 has a front portion 64 which can be circumferentially closed and whose thin cross section corresponds to the cross section of the plunger 21 with the slight enlargement required for slight play. A long portion 65 of the sleeve 34' having a larger inside height for receipt of the spring 19 is connected to front portion 64. The spring 19 can be supported on a contact on the rear end of this portion 65. The plunger head 21 can be forced in this inner space receiving the spring 19 on motion of the plunger member 20 to the right more or less further under compression of the spring 19 whereby its linear guide is completely in the portion 64. The spring 19 can be compressed and contacts with its front end on an edge of the transition from portion 64 to portion 65 of the sleeve 34'. The portion 65 can have the same interior width as the portion 64.

The spring 19 forms a wavelike flat spring in this embodiment which extends in the direction of the longitudinal axis 69 of the plunger member 20 and thus extends in the direction of its motion as shown and forms a wavelike segment transverse to the longitudinal axis 69 whose geometric wave plane at half height corresponds to the longitudinal central plane of the plunger member 20 or to one only spaced slightly parallel to it or approximately parallel.

In many cases it is also possible to provide that the wavelike spring 19 is not rotated in regard to the plunger member 20, i.e. that then the wave plane of its transverse wave runs approximately perpendicularly to the geometric width longitudinal central plane of the plunger member 20.

In the embodiment according to FIGS. 19 to 20 the spring 19 is not twisted or rotated relative to the width longitudinal plane of the planar plunger member 20 in its entirety about 90° but it has a cornered snakelike coil which can run substantially in the plane of the plunger member 20 and thus the plunger head 21, or inclined to that plane, however at the peaks the approximately rectangular or square waves are bent to form rectangular flaps 67, 67' approximately at 90° to the plane of the plunger head 21.

For this purpose the spring 19 has the illustrated undulating course (FIG. 21) in a planar plate portion 62" whereby the bend angle of the spring at the transition from the transverse cross piece 71 to the flaps 67 and/or 67' amounts to approximately 90°. This bending can amount to 90° or more or less than 90°.

Each rectangular shape flap 67,67' extending in the longitudinal direction of the bar 12' is linear and planar and these flaps are formed by bending along the fold lines 63 indicated by dashed lines in FIG. 21.

These fold lines can be provided suitably so that the width b2 (FIG. 19) of the spring 19 corresponds approximately to the width by of the plunger head 21. The flaps 67 and/or 67, 67' are attached by cross pieces 71 of the associated spring 19. These cross pieces 71 can be parallel to the geometric width longitudinal central plane of the plunger head 21 in the embodiment according to FIG. 19, advantageously in that case. The cross piece 71 and the flaps 67,67' can advantageously be linear or have another course for embodiment arced or curved.

With the bar 12' according to FIG. 19 all flaps 6 of the cross pieces 71 are bent from the same side. Their outside measured maximum height corresponds to the maximum height h2 of this spring 19 corresponding to the maximum cross sectional width x of the metal sheet forming the spring 19. This height h2 again is substantially larger than the thickness d of the metal sheet forming this spring 19 and the plunger member 20. For the flaps 67,67' x=h2 and y=d as seen in FIG. 24.

For the cross pieces 71 of the spring 19 according to FIG. 19 in contrast x=d and y corresponds to its width. The maximum width b2 of the spring 19 forming a curved folded spring with a linear longitudinal axis extending in the motion direction of the plunger member 20 and acted upon substantially at folds in axial compression can be appropriately approximately the maximum width b1 of the plunger head 21 and/or the plunger member 20 and larger, advantageously substantially larger, than the height h2 of the spring 19. The wave plane of the spring 19 runs parallel or approximately parallel to the geometric width longitudinal central plane of the plunger member 20.

The bar according to FIG. 20 differs substantially from the bar according to FIG. 19 in that on the one side of the spring 19 the planar flaps 67 are bent upwardly and on the other side the planar flaps 67' are bent downwardly approximately 90° or contrastingly somewhat more or less than 90°.

Particularly it can be provided that with this spring 19 according to FIG. 20 the cross piece 71 does not fall on the geometric width longitudinal central plane of the plunger member 20 but is suitably inclined to this plane so that the flaps 67 and 67' have the same height directed oppositely and so the maximum height h2 of this spring 19 corresponds to the outer measured height h2 of that arbitrarily chosen for the flaps 67, 67' and not to the doubled flap height.

With the same breaking strength and otherwise practically the same properties of the spring a small structural height of the bar 12' is attained.

Also here practically only half the structural height is attained as when the cross piece 71 could run parallel to the plane of the plunger head 21. Each cross section of the spring 19 through a piece 71 taken along the section line 23—23 of FIG. 20 has then a Z-shaped form as shown in FIG. 23.

In FIG. 23 the geometric wave plane of this spring 19 running at half height of the spring 19 is indicated with 79 and it runs parallel or approximately parallel to the geometric width longitudinal central plane of the plunger member and can correspond advantageously to this width longitudinal central plane.

Also with this bar 12' according to FIGS. 19 and 20 the maximum width b1 of the plunger member 20 which is approximately b2 is larger, advantageously substantially larger than the maximum height h2 of the bar 12'.

With the spring 19 forming the curved bended spring with the linear longitudinal axis acting substantially on the folds with maximum compression according to the embodiment according to FIGS. 19 and 20 the peaks of the undulating coil of the spring 19 are the regions in most danger of breaking. Since the height h2 of these flaps 67, 67' is greater, advantageously substantially greater, than the thickness d of the metal sheet also the safety from breaking of these springs is considerably increased. The height h2 is here simultaneously the maximum height of this bar 12'.

In many cases it is desirable and appropriate that the maximum height h1 of the plunger head 21 and contrastingly the entire plunger member 20 corresponds approximately to the maximum height h2 of the spring 19, advantageously the same height h2 or somewhat less than this height h2, since it is possible to provide the interior height of the slot or the like leading to the plunger head 21 corresponding to the interior height for the spring 19 so that the interior cross section of the slider guide or another slot provided for the plunger guide or the like not only in the vicinity where the plunger is guided, but also in the vicinity where the spring 19 is located, can be provided nearly constant over the length of the region leading to and receiving the spring 19 and the plunger 21 or near to that region.

It is advantageous to provide the plunger head 21 and still further along the plunger member 20 or contrastingly the entire length of the plunger member 20 with a profile having the maximum height h1 (FIG. 22A), where h1 is larger than the thickness d of the metal sheet forming the plunger member 20.

Suitable individual shapes are illustrated in FIGS. 22A to 22G. In FIG. 22A these shapes are U-shape, in FIG. 22B Z-shape, in FIG. 22C U-shape with a deep base, in FIG. 22G S-shape, in FIG. 22E W-shape, in FIG. 22 U-shape with raised central base and M-shape in FIG. 22G.

For the ratio of the maximum width b1 of the plunger head 21 forming one such profile to their maximum height h1 can then take an approximate value as for the ratio of the maximum width b2 to the maximum height h2 of the spring 19 whereby advantageously h1 corresponds approximately to h2 and b1 corresponds approximately to b2. Bars 12' with such plunger profiles can then be inserted in the slots 11 of a slider guide 34 according to FIGS. 11 to 14 or in slots 11 of a plate device according to FIGS. 1 to 3. Also there are other possibilities. The bars 12' can also be put on the contact points with contact heads formed or separated on them.

Usually it is provided appropriately that the maximum width of the bar 12' is greater, advantageously at least twice as great as its maximum height. Advantageously this maximum width can be at least three times greater, advantageously 4 to 8 times greater than the maximum height of the bar 12'.

Also usually appropriately the maximum length of the bar 12' can be many times greater than its maximum width, advantageously this maximum length can be at least 10 times, especially advantageously at least 25-times, and most beneficially about 30 to 120 times greater than its maximum width.

In these constructions the bars 12' are made of metal sheet by punching or stamping and contrastingly by folding and/or stamping the advantageously punched sheet sections and have linear longitudinal axes. The front and rear free longitudinal end portions 75, 76 of these bars 12' are formed by the front and rear longitudinal end portions 75,76 of the metal sheet portions from which they are formed which is particularly well suited to other structures and functions. Every bar 12' is positioned in a slot 11 associated with it. Between its spring 19 and its front end only one single plunger 21 is present which can have a continuous constant width (e.g. FIG. 2A) or also at least one recess reduced in its width (FIG.7).

Instead of the plunger head 21 of the plunger member 20 guided linearly in a single slot it can also be provided that it is linearly guided in several slots aligned with each other or in some other linear guide. The guide of the plunger head 21 of the plunger member 20 can appropriately be fit in at least one slot or other linear guide.

In each such slot or the like a single bar 12' is located so that neighboring bars 12' cannot contact each other in the contactor.

The motion of the plunger member 20 of the associated bar occurring in testing of the device to be tested occurs in the direction of its longitudinal axis.

At least then when the maximum height of the bar is smaller than its maximum width as seen one can denote the flat bar or the flat bar. Also each bar 12' is secured against rotation in the guide by its nonround form.

The bars 12' according to FIGS. 17 to 24 allow problem-free punch engineering, a high safety from breaking of its springs with satisfactory spring characteristics and reduced cross sectional dimensions. The contacts allow simultaneous contact of all pads of the chips in which the pads are located along all four sides of the chips in a straight row. One can position the resilient contact pins having such bars 12' or the bars 12' contacting one such pad row so that the width longitudinal central planes of these bars are positioned parallel to each other since that particularly allows reduced central spacing of adjacent bars with high safety from breaking and problem free spring characteristic. Thus the contactor can serve for simultaneously contacting of the pads of a chip or the simultaneous contact with several of many such chips.

We claim:

1. In a contactor for an electronic tester for testing an electronic device such as a printed circuit board, an integrated circuit and the like, said contactor having at least one resilient contact pin which is electrically conducting and engagable with a contact or terminal of said electronic device, each of said resilient contact pins having a plunger member whose plunger head is guided linearly in a slot, said plunger member being followed in the axial direction by a spring, the improvement wherein said plunger member and said spring of each of said resilient contact pins are jointly formed in one piece from a portion of metal sheet to form a resilient axial bar.

2. The improvement defined in claim 1 wherein said plunger member of said bar is flat.

3. The improvement defined in claim 1 wherein said spring and/or said plunger head of said bar forms a planar region of said bar and said bar is entirely flat.

4. The improvement defined in claim 1 wherein the longitudinal direction of said bar is linear.

5. The improvement defined in claim 1 wherein said spring has an undulating configuration with transverse undulations with respect to the longitudinal direction of said bar.

6. The improvement defined in claim 1 wherein said spring formed by said portion of said metal sheet of said bar is generally transverse to a geometric width longitudinal central plane of said plunger member.

7. The improvement defined in claim 6 wherein the wave plane of said transversely undulating spring is substantially parallel to the geometric width longitudinal central plane of said plunger member.

8. The improvement defined in claim 6 wherein said spring formed by said portion of said metal sheet is oriented at least substantially approximately perpendicular to said geometric width longitudinal central plane of said plunger member.

9. The improvement defined in claim 7 wherein said peaks of said transversely undulating spring are formed by a plurality of flaps which are bent away through a plane defined by a cross piece connecting two opposing ones of said flaps.

10. The improvement defined in claim 9 wherein said flaps are planar and bent at right angles to said cross piece oriented approximately perpendicularly to said geometric width longitudinal plane.

11. The improvement defined in claim 1 wherein said bar has at least one deformation for reinforcement, and said bar has a foot piece connected to said plunger member.

12. The improvement defined in claim 1 wherein said resilient contact pin has a linear slider guide in which said plunger head of said plunger member is slidable axially and in which said spring is located and said resilient contact pin consists of said slider guide and said bar.

13. The improvement defined in claim 12 wherein said slider guide is made of said metal sheet.

14. The improvement defined in claim 13 wherein said slider guide forms a linear bar with a channel cross section.

15. The improvement defined in claim 13 wherein said slider guide has at least one stop for said bar.

16. The improvement defined in claim 15 wherein said slider guide has two of said stops between which said spring of said bar is located and compressed.

17. The improvement defined in claim 1 wherein a contact head acting as an internal contact for said electronic device is attached to said bar and a point of said resilient contact pin serving for internal contact with said electronic device is formed by a metal sheet forming the bar in a single piece.

18. The improvement defined in claim 1 wherein said contactor has a support in which a plurality of slots are provided which provide slider guides for the plunger members of a number of contact pins whose bars are inserted in said slots.

19. The improvement defined in claim 18 wherein a contact head formed as an attached member or in one piece with said bar is provided on said bar, said bar including said contact head forming said resilient contact pin.

20. The improvement defined in claim 1 wherein a maximum width of said plunger member is larger than a maximum height of said plunger member.

21. The improvement defined in claim 20 wherein said maximum width is at least two times greater than said maximum height.

22. The improvement defined in claim 1 wherein a maximum width of said spring is greater than a maximum height of said spring.

23. The improvement defined in claim 22 wherein said maximum width is at least twice as great as said maximum height.

24. The improvement defined in claim 1 wherein a maximum width of said bar is greater than a maximum height of said bar.

25. The improvement defined in claim 24 wherein said maximum width is at least twice as great as said maximum height.

26. The improvement defined in claim 1 wherein a maximum width of said bar is greater than a thickness of said sheet metal forming said bar.

27. The improvement defined in claim 26 wherein said width is at least twice as great as said thickness.

28. The improvement defined in claim 26 wherein said width is at least three times as great as said thickness.

29. The improvement defined in claim 26 wherein said width is about four to twenty times said thickness.

30. The improvement defined in claim 26 wherein said width is about 4 to 10 times said thickness.

31. The improvement defined in claim 1 wherein said spring comprises a flat ring provided with at least one hole therethrough.

32. The improvement defined in claim 31 wherein said spring includes a plurality of said flat rings attached together in a row.

33. The improvement defined in claim 1 wherein said spring of said bar is guided in a slider guide which also at least partially guides said plunger head of said plunger member.

34. The improvement defined in claim 14 wherein said bar has an embossing projecting into an intervening space existing between both of two legs of said slider guide having said C-shape cross section.

35. The improvement defined in claim 1 wherein a portion of a formed metal sheet is used for said bar, the thickness of said metal sheet forming said bar being about 0.05 to 0.40.

36. The improvement defined in claim 35 wherein said thickness is between about 0.09 to 0.25 mm.

37. The improvement defined in claim 35 wherein the ratio of the cross sectional width to the cross sectional height of the cross section of said metal sheet forming said spring is at least greater than 1:1 for a cross section acted on most strongly by bending.

38. The improvement defined in claim 37 wherein said ratio is greater than 2:1.

39. The improvement defined in claim 1 wherein both longitudinal end portions of said bar are formed by both longitudinal end regions of a metal sheet from which said bar is formed and said bar is said located in a slot therefor.

* * * * *